United States Patent
Lee et al.

(10) Patent No.: US 10,502,790 B2
(45) Date of Patent: Dec. 10, 2019

(54) BATTERY INTERNAL RESISTANCE MEASURING DEVICE HAVING A DIFFERENTIAL VALUE CALCULATING UNIT TO TREAT TWO ADJACENT FIRST VOLTAGE SAMPLING VALUES WITH FIRST SLOPE VALUE CALCULATION

(71) Applicant: PROLIFIC TECHNOLOGY INC., Taipei (TW)

(72) Inventors: Yun-Kuo Lee, Hsinchu County (TW); Chia-Chang Hsu, Hsinchu County (TW); Ren-Yuan Yu, Hsinchu County (TW); Ching-Te Chen, Hsinchu (TW)

(73) Assignee: Prolific Technology Inc. (TW)

( * ) Notice: Subject to any disclaimer, the term of this patent is extended or adjusted under 35 U.S.C. 154(b) by 121 days.

(21) Appl. No.: 15/847,913

(22) Filed: Dec. 20, 2017

(65) Prior Publication Data

US 2018/0203075 A1   Jul. 19, 2018

(30) Foreign Application Priority Data

Jan. 13, 2017   (TW) .............................. 106101167 A

(51) Int. Cl.
*G01R 31/389* (2019.01)
*G01R 31/36* (2019.01)
*G01R 31/392* (2019.01)
*G01R 31/3842* (2019.01)

(52) U.S. Cl.
CPC ....... *G01R 31/389* (2019.01); *G01R 31/3648* (2013.01); *G01R 31/3842* (2019.01); *G01R 31/392* (2019.01)

(58) Field of Classification Search
USPC .................................. 324/426–436; 320/132
See application file for complete search history.

(56) References Cited

U.S. PATENT DOCUMENTS

| | | | |
|---|---|---|---|
| 7,352,156 B2 * | 4/2008 | Ashizawa ............ | G01R 31/367 320/132 |
| 2009/0051364 A1 * | 2/2009 | Ishida ................... | H01M 10/48 324/430 |
| 2018/0224507 A1 * | 8/2018 | Nagata .................. | H02J 7/0047 |

* cited by examiner

*Primary Examiner* — Jay Patidar

(57) ABSTRACT

The present invention discloses a battery internal resistance measuring device and a method thereof, wherein the battery internal resistance measuring device comprises a voltage detecting unit, at least one measurement resistor, at least one switch, and a measurement controller. By means of further explanation, the measurement controller at least comprises a differential value calculating unit for treating a differential value calculation or a slope calculation to each two of adjacent voltage sampling values on a waveform of a discharge voltage signal of the battery, such that the measurement controller can subsequently find out a discharge starting point and a discharge ending point according to data of the differential value calculations or the slope calculations. Eventually, the measurement controller calculates an internal resistance of the battery after picking up an open-circuit voltage and a short-circuit voltage from the discharge starting point and the discharge ending point.

17 Claims, 11 Drawing Sheets

S7 →

S8 — the measurement controller 13 finding out a second smallest differential value or a second smallest slope value from the second differential values and the second slope values, such that a discharge ending point from the waveform of the discharge voltage signal is determined, and then a short-circuit voltage is picked up from the discharge voltage signal according to the discharge ending point

↓

S9 — the measurement controller 13 calculating an internal resistance Rint of the battery 2 based on the open-circuit voltage, the short-circuit voltage and the resistance of the measurement resistor Rms1

FIG. 6C

BATTERY INTERNAL RESISTANCE MEASURING DEVICE HAVING A DIFFERENTIAL VALUE CALCULATING UNIT TO TREAT TWO ADJACENT FIRST VOLTAGE SAMPLING VALUES WITH FIRST SLOPE VALUE CALCULATION

BACKGROUND OF THE INVENTION

1. Field of the Invention

The present invention relates to the technology field of battery monitoring systems (BMS), and more particularly to a battery internal resistance measuring device and a method thereof.

2. Description of the Prior Art

With the high development of modern technologies, batteries are getting more and more important and widely used in electrical or electronic products, such as motorcycles, automobiles, computers, cell phones, and so on. Ordinary batteries have a service life about 2-3 years, but that does not mean all commercial batteries can be used for 2-3 years. Therefore, how to monitor the capacity or lifetime of a battery used in an electrical or electronic product becomes an important issue.

Load testing method is often adopted for measuring the residual capacity of a battery in use. FIG. 1 shows a topology diagram of an internal resistance measuring circuit. From FIG. 1, it is understood that the internal resistance measuring circuit 1' comprises: a current detecting unit 11', a voltage detecting unit 12', a switch SW', and a measurement resistor Rmes'. In order to measure an equivalent internal resistor Rint' of the battery 2', a load resistor $R_L'$ is electrically connected to the battery 2' for making the battery 2' output a DC current, such that the current detecting unit 11' is able to sample a current Imes' passing the measurement resistor Rmes'. As a result, a dropout voltage Vmes' across the measurement resistor Rmes' can be calculated or directly measured by the voltage detecting unit 12'. It is worth explaining that, a PWM signal is generated for properly controlling an ON/OFF cycle of the switch SW'.

Continuously referring to FIG. 1, and please simultaneously refer to FIG. 2, where three waveform graphs are provided. In FIG. 2, waveform graph (a) depicts a waveform of the PWM signal, waveform graph (b) represents an ideal waveform of an output voltage signal of the battery 2', and waveform graph (b) shows a real waveform of the output voltage signal. After comparing the two waveform graphs (b) and (c), it is figured out that voltage-dependent Helmholtz capacitance is produced during the discharge of the battery 2' and causes the real waveform of the output voltage signal become an incomplete square waveform. It is worth explaining that, a short-circuit voltage (i.e., the battery terminal voltage $V_E'$) would be measured by the voltage detecting unit 12' during the switch SW' is at ON state, and the short-circuit voltage is marked in waveform graph (c) by "Vsh'". On the other hand, when the SW' is at OFF state, the voltage detecting unit 12' measures an open-circuit voltage from the battery 2', which is marked in waveform graph (c) by "Vop'". Therefore, internal resistor Rint' of the battery 2' can be calculated by using following mathematic equations:

$$R_{int}'=(V_{op}'-V_{sh}')/I_{mes}'=((V_{op}'-V_{sh}')\times R_{mes}')/V_{sh}' \quad (1)$$

$$I_{mes}'=(V_{sh}'/R_{mes}') \quad (2)$$

From above descriptions, it is known that the internal resistance measuring circuit 1' (i.e., load testing architecture) is the simplest framework to measure the internal resistance of a battery. However, when being applied to measure the battery internal resistance, the internal resistance measuring circuit 1' shows some practical drawbacks as follows:

(1) Owing to the Helmholtz capacitance effect occurring during the discharge of the battery 2', it is difficult for back-end analog-to-digital converter to precisely find out corresponding sampling time point so as to pick out the open-circuit voltage Vop' and the short-circuit voltage Vsh' from the output voltage signal of the battery 2'. Therefore, it is reasonable that the open-circuit voltage Vop' and the short-circuit voltage Vsh' measured in the case of very small internal resistor (mΩ) certainly be incorrect, that would result in an error measurement of battery internal resistance.

(2) In order to pick up correct open-circuit voltage Vop' and short-circuit Vsh', it needs to continuously prolong the discharging time of the battery 2' until the waveform of the output voltage signal tends to be stable, such that the back-end analog-to-digital converter can sense correct open-circuit voltage Vop' and short-circuit Vsh'. However, continuously prolonging battery's discharging time would result in excessive consumption of the battery 2'.

(3) On the other hand, the internal resistance measuring circuit 1' (i.e., load testing architecture) can just be used for measuring the internal resistance of a specific battery, but fails to measure difference internal resistances from various types of batteries. For instance, the internal resistance measuring circuit 1' certainly measure an incorrect internal resistance if making a battery with large capacity discharge by small current. Moreover, if the internal resistance measuring circuit 1' makes a battery with small capacity discharge by large current, the battery with small capacity would be burned out.

From above descriptions, it is clear that there are no improvement methods, approaches or solutions for effectively measuring difference internal resistances from various types of batteries; in view of that, inventors of the present application have made great efforts to make inventive research thereon and eventually provided a battery internal resistance measuring device and a method thereof.

SUMMARY OF THE INVENTION

Owing to the fact that the conventional internal resistance measuring circuit fails to find out the best sampling time point from the waveform of a discharge voltage signal of a battery, the primary objective of the present invention is to disclose a battery internal resistance measuring device and a method thereof, wherein the battery internal resistance measuring device comprises a voltage detecting unit, at least one measurement resistor, at least one switch, and a measurement controller. Particularly, this battery internal resistance measuring device is able to find out a discharge starting point and a discharge ending point based on the proposed method. By means of further explanation, the measurement controller at least comprises a differential value calculating unit for treating a differential value calculation or a slope calculation to each two of adjacent voltage sampling values on the waveform of the discharge voltage signal of the battery, such that the measurement controller can subsequently find out the discharge starting point and the discharge ending point according to data of the differential value calculations or the slope calculations. Eventually, the measurement controller calculates an internal resistance of the battery after picking up an open-circuit voltage and a short-circuit voltage from the discharge starting point and the discharge ending point.

For achieving the primary objective of the present invention, the inventor of the present invention provides an embodiment for the battery internal resistance measuring device, comprising:

a voltage detecting unit, being electrically connected to a battery;

at least one measurement resistor, being electrically connected to the voltage detecting unit in parallel;

at least one switch, being electrically connected to the measurement resistor in series; and a measurement controller, being electrically connected to the voltage detecting unit, and comprising a differential value calculating unit;

wherein the voltage detecting unit is able to be electrically connected with a load in parallel, such that the voltage detecting unit correspondingly provides a discharge voltage signal of the battery to the measurement controller as the measurement controller generates a switch controlling signal to the switch;

wherein the measurement controller picks up a plurality of first voltage sampling values from a waveform of the discharge voltage signal based on a first sampling rate during a switching-off period of the switch; moreover, the measurement controller picking up a plurality of second voltage sampling values from the waveform of the discharge voltage signal based on a second sampling rate during a switching-on period of the switch;

wherein the differential value calculating unit is configured to treat each two of adjacent first voltage sampling values with a first differential value calculation or a first slope calculation, and also apply a second differential value calculation or a second slope calculation to each two of adjacent second voltage sampling values, such that the measurement controller can find out a discharge starting point and a discharge ending point from the waveform of the discharge voltage signal.

Moreover, in order to achieve the primary objective of the present invention, the inventor of the present invention provides one embodiment for the battery internal resistance measuring method, comprising following steps:

(1) providing a battery internal resistance measuring device comprising a voltage detecting unit electrically connected to a battery, at least one measurement resistor electrically connected to the voltage detecting unit in parallel, at least one switch electrically connected to the measurement resistor in series, and a measurement controller electrically connected to the voltage detecting unit; and then, making the voltage detecting unit be electrically connected with a load in parallel and providing a switch controlling signal to the switch by using the measurement controller;

(2) receiving a discharge voltage signal of the battery sensed by the voltage detecting unit by the measurement controller;

(3) the measurement controller picking up a plurality of first voltage sampling values from a waveform of the discharge voltage signal based on a first sampling rate during a switching-off period of the switch;

(4) a differential value calculating unit of the measurement controller applying each two of adjacent first voltage sampling values with a first differential value calculation or a first slope calculation, so as to obtain a plurality of first differential values and a plurality of first slope values;

(5) the measurement controller finding out a first smallest differential value or a first smallest slope value from the first differential values and the first slope values, such that a discharge starting point from the waveform of the discharge voltage signal is determined, and then an open-circuit voltage is picked up from the discharge voltage signal according to the discharge starting point;

(6) the measurement controller picking up a plurality of second voltage sampling values from the waveform of the discharge voltage signal based on a second sampling rate during a switching-on period of the switch;

(7) the differential value calculating unit of the measurement controller applying each two of adjacent second voltage sampling values with a second differential value calculation or a second slope calculation, so as to obtain a plurality of second differential values and a plurality of second slope values;

(8) the measurement controller finding out a second smallest differential value or a second smallest slope value from the second differential values and the second slope values, such that a discharge ending point from the waveform of the discharge voltage signal is determined, and then a short-circuit voltage is picked up from the discharge voltage signal according to the discharge ending point; and (9) the measurement controller calculating an internal resistance of the battery based on the open-circuit voltage, the short-circuit voltage and the resistance of the measurement resistor.

In the embodiment of the battery internal resistance measuring method, further following step connected between the step (4) and the step (5):

(4') determining whether the first differential value is smaller than a discriminable value; if yes, proceeding back to the step (3); otherwise, proceeding to the step (5).

In the embodiment of the battery internal resistance measuring method, wherein the first sampling rate is equal to or different from the second sampling rate.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein:

FIG. 6A, FIG. 6B and FIG. 6C show flowchart diagrams of a battery internal resistance measuring method according to the present invention;

DETAILED DESCRIPTION OF THE PREFERRED EMBODIMENTS

To more clearly describe a battery internal resistance measuring device and a method thereof according to the present invention, embodiments of the present invention will be described in detail with reference to the attached drawings hereinafter.

First Embodiment

Figure 3:
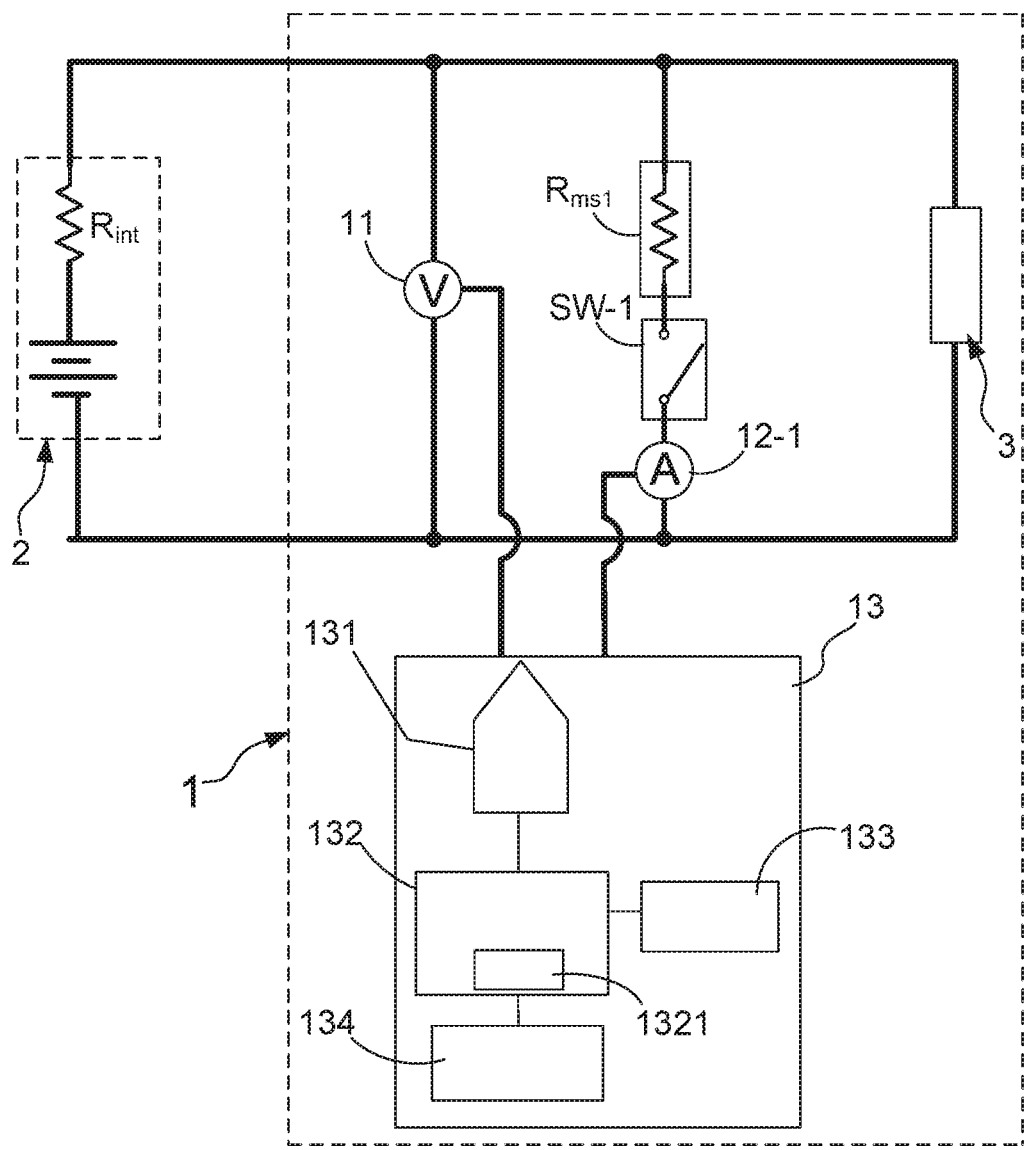
FIG. 3 shows a first circuit framework of a battery internal resistance measuring device according to the present invention.

With reference to FIG. 3, there is provided a first circuit framework of a battery internal resistance measuring device according to the present invention. As FIG. 3 shows, the battery internal resistance measuring device 1 is connected between a battery 2 and a load 3, and comprises: a voltage detecting unit 11, a first measurement resistor Rms1, a first switch SW-1, a first current detecting unit 12-1, and a measurement controller 13. The voltage detecting unit 11 is electrically connected to the battery 2 and the load 3 in parallel, and the first measurement resistor Rms1 is electrically connected to the voltage detecting unit 11 in parallel. On the other hand, the first switch SW-1 is electrically connected to the first measurement resistor Rms1 in series, and the first current detecting unit 12-1 is electrically connected to the first switch SW-1 in series. It is worth explaining that, the voltage detecting unit 11 is adopted for measuring a dropout voltage across the first measurement resistor Rms1, so as to further derive the current passing through the first measurement resistor Rms1; in such case, the first current detecting unit 12-1 would not be used and can be removed from the circuit framework of the battery internal resistance measuring device 1. On the contrary, it is able to firstly measure the current passing through the first measurement resistor Rms1, and then derive the dropout voltage across the first measurement resistor Rms1; in such case, the voltage detecting unit 11 would not be used and can be removed from the circuit framework of the battery internal resistance measuring device 1.

Figure 2:
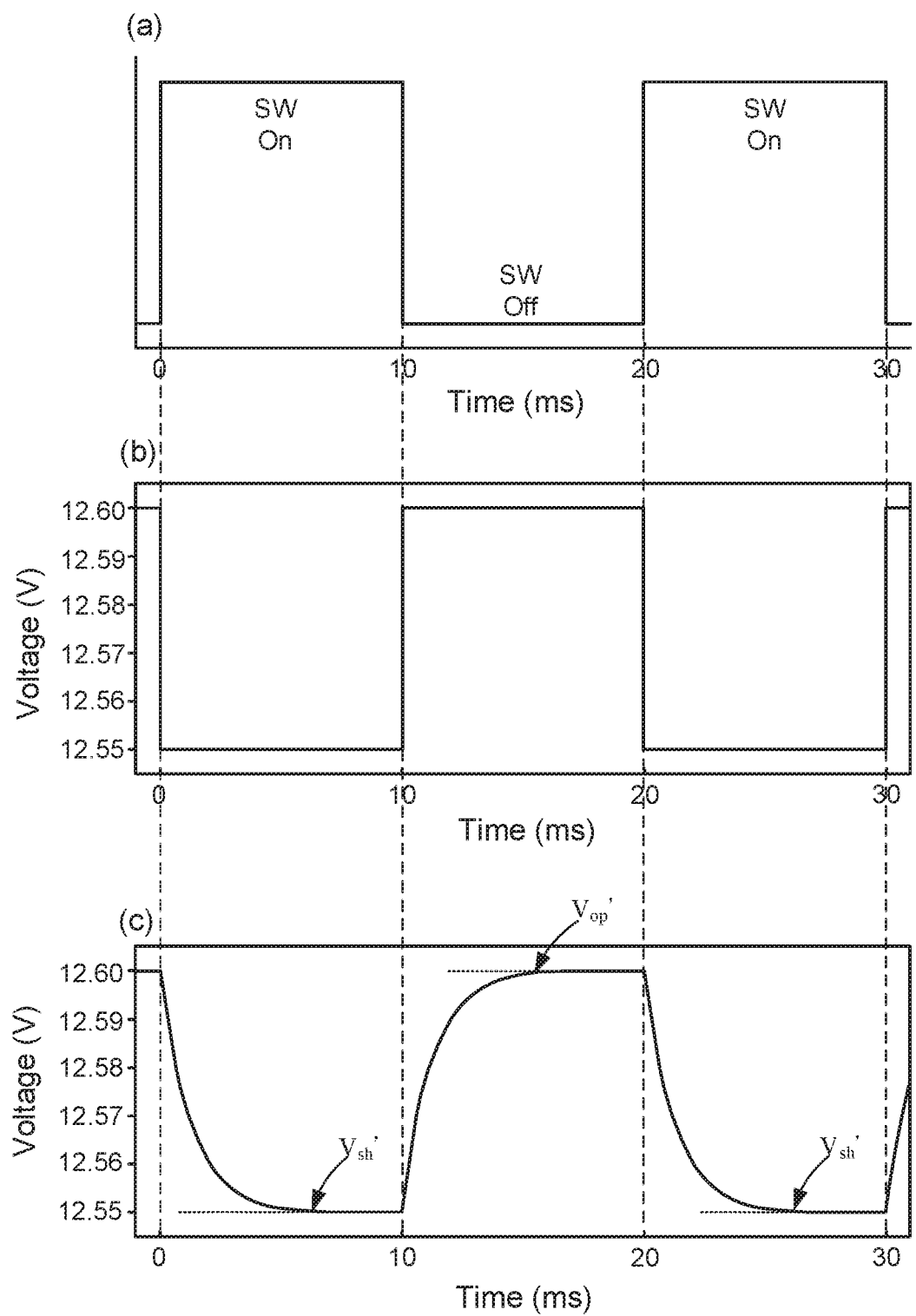
FIG. 2 shows three waveform graphs.

From FIG. 3, it is understood that the measurement controller 13 is electrically connected to the voltage detecting unit 11 and the first current detecting unit 12-1. After the measurement controller 13 generates a switch controlling signal to the first switch SW-1, a discharge voltage signal sensed by the voltage detecting unit 11 and a discharge current signal detected by the first current detecting unit 12-1 are transmitted to the measurement controller 13. FIG. 2 shows two waveform graphs, wherein waveform graph (a) depicts the waveform of the switch controlling signal, and waveform graph (b) represents a real waveform of the discharge voltage signal. It needs to further explain that, the measurement controller 13 comprises an analog-to-digital converting unit 131, a microprocessor 132, a storage unit 133, and an output unit 134, wherein the microprocessor 132 particularly comprises a differential value calculating unit 1321. Engineers skilled in design and development of electronic devices should know that the differential value calculating unit 1321 is integrated in the microprocessor 132 by a form of hardware, software or firmware.

In the present invention, the measurement controller 13 is configured to pick up a plurality of first voltage sampling values from a waveform of the discharge voltage signal based on a first sampling rate during a switching-off period of the first switch SW-1. The waveform graph (a) of FIG. 4 indicates that the first switch SW-1 is turned to an ON state and an OFF state cyclely by the switch controlling signal outputted by the microprocessor 132.

Pick-up of an Open-circuit Voltage Vop of the Battery

Figure 4:
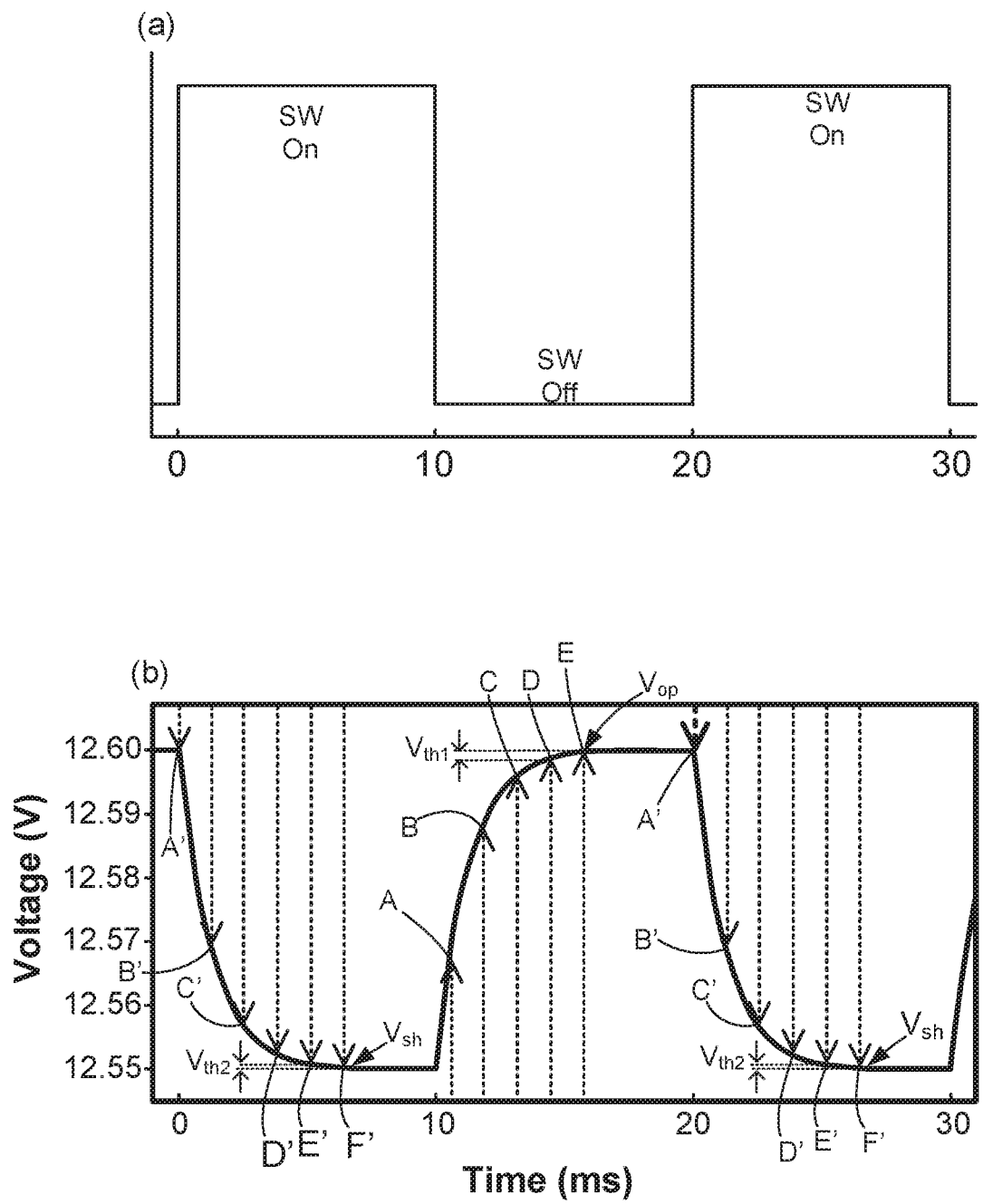
FIG. 4 shows two waveform graphs.

For instance, during the switching-off period of the first switch SW-1, five first sampling voltage values are picked up from different sampling points A, B, C, D, and E locating at the waveform curve as shown in FIG. 4. Subsequently, the differential value calculating unit 132 would treat each two of adjacent first voltage sampling values with a first differential value calculation or a first slope calculation, so as to obtain a plurality of first differential values and a plurality of first slope values. It is noting that the two calculations can be executed simultaneously or alternatively. Moreover, calculation formulas for obtaining the first differential values and the first slope values are listed in following Table (1) and Table (2).

TABLE 1

| First differential values | Calculation formulas | Descriptions |
| --- | --- | --- |
| $\Delta V1$ | $V_B - V_A$ | $\Delta V1$ is obtained by subtracting the voltage value sensed at sampling point A from the voltage value detected at sampling point B. |
| $\Delta V2$ | $V_C - V_B$ | $\Delta V2$ is obtained by subtracting the voltage value sensed at sampling point B from the voltage value detected at sampling point C. |
| $\Delta V3$ | $V_D - V_C$ | $\Delta V3$ is obtained by subtracting the voltage value sensed at sampling point C from the voltage value detected at sampling point D. |
| $\Delta V4$ | $V_E - V_D$ | $\Delta V4$ is obtained by subtracting the voltage value sensed at sampling point D from the voltage value detected at sampling point E. |

TABLE (2)

| First slope values | Calculation formulas | Descriptions |
| --- | --- | --- |
| $m_1$ | $\dfrac{(V_B - V_A)}{(t_B - t_A)}$ | m1 is obtained after dividing the time difference between sampling point B and sampling point A into $\Delta V1$. |
| $m_2$ | $\dfrac{(V_C - V_B)}{(t_C - t_B)}$ | m2 is obtained after dividing the time difference between sampling point C and sampling point B into $\Delta V2$. |
| $m_3$ | $\dfrac{(V_D - V_C)}{(t_D - t_C)}$ | m3 is obtained after dividing the time difference between sampling point D and sampling point C into $\Delta V3$. |
| $m_4$ | $\dfrac{(V_E - V_D)}{(t_E - t_D)}$ | m4 is obtained after dividing the time difference between sampling point E and sampling point D into $\Delta V4$. |

After obtaining the first differential values, the microprocessor 132 is able to next compare each of the first differential values with a first threshold differential value. The first differential value is defined to be a first smallest differential value when being verified to be smaller than the first threshold differential value. For example, $\Delta V4$ listed in Table (1) is the said first smallest differential value. Consequently, the microprocessor 132 verifies that the sampling point E is a (best) discharge starting point, and then the analog-to-digital converting unit 131 is informed to pick up the open-circuit voltage Vop from the sampling point E. On the other hand, after obtaining the first slope values, the microprocessor 132 is able to next compare each of the first slope values with a first threshold slope value. The first slope value is defined to be a first smallest slope value when being verified to be smaller than the first threshold slope value. For example, $m_4$ listed in Table (2) is the said first smallest slope value. Consequently, the microprocessor 132 verifies that the sampling point E is the (best) discharge starting point.

Pick-up of a Short-circuit Voltage Vsh of the Battery

In addition, the measurement controller 13 is also configured to pick up a plurality of second voltage sampling values from the waveform of the discharge voltage signal based on a second sampling rate during a switching-on period of the first switch SW-1. For instance, during the switching-on period of the first switch SW-1, six second sampling voltage values are picked up from different sampling points A', B', C', D', E', and F' locating at the waveform curve as shown in FIG. 4. Subsequently, the differential value calculating unit 132 would treat each two of adjacent second voltage sampling values with a second differential value calculation or a second slope calculation, so as to obtain a plurality of second differential values and a plurality of second slope values. It is noting that the two calculations can be executed simultaneously or alternatively. Moreover, calculation formulas for obtaining the second differential values and the second slope values are listed in following Table (3) and Table (4).

TABLE 3

| Second differential values | Calculation formulas | Descriptions |
|---|---|---|
| $\Delta V1'$ | $V_B' - V_A'$ | $\Delta V1'$ is obtained by subtracting the voltage value sensed at sampling point A' from the voltage value detected at sampling point B'. |
| $\Delta V2'$ | $V_C' - V_B'$ | $\Delta V2'$ is obtained by subtracting the voltage value sensed at sampling point B' from the voltage value detected at sampling point C'. |
| $\Delta V3'$ | $V_D' - V_C'$ | $\Delta V3$ ' is obtained by subtracting the voltage value sensed at sampling point C' from the voltage value detected at sampling point D'. |
| $\Delta V4'$ | $V_E' - V_D'$ | $\Delta V4'$ is obtained by subtracting the voltage value sensed at sampling point D' from the voltage value detected at sampling point E'. |
| $\Delta V5'$ | $V_F' - V_E'$ | $\Delta V5'$ is obtained by subtracting the voltage value sensed at sampling point E' from the voltage value detected at sampling point F'. |

TABLE (4)

| Second slope values | Calculation formulas | Descriptions |
|---|---|---|
| $m_1'$ | $\dfrac{(V_B' - V_A')}{(t_B' - t_A')}$ | m1' is obtained after dividing the time difference between sampling point B' and sampling point A' into V1'. |
| $m_2'$ | $\dfrac{(V_C' - V_B')}{(t_C' - t_B')}$ | m2' is obtained after dividing the time difference between sampling point C' and sampling point B' into V2'. |
| $m_3'$ | $\dfrac{(V_D' - V_C')}{(t_D' - t_C')}$ | m3' is obtained after dividing the time difference between sampling point D' and sampling point C' into V3'. |
| $m_4'$ | $\dfrac{(V_E' - V_D')}{(t_E' - t_D')}$ | m4' is obtained after dividing the time difference between sampling point E' and sampling point D' into V4'. |
| $m_5'$ | $\dfrac{(V_F' - V_E')}{(t_F' - t_E')}$ | M5' is obtained after dividing the time difference between sampling point F' and sampling point E' into V5'. |

After obtaining the second differential values, the microprocessor 132 is able to next compare each of the second differential values with a second threshold differential value. The second differential value is defined to be a second smallest differential value when being verified to be smaller than the second threshold differential value. For example, $\Delta V5'$ listed in Table (3) is the said second smallest differential value. Consequently, the microprocessor 132 verifies that the sampling point F' is a (best) discharge ending point, and then the analog-to-digital converting unit 131 is informed to pick up the short-circuit voltage Vsh from the sampling point F'. On the other hand, after obtaining the second slope values, the microprocessor 132 is able to next compare each of the second slope values with a second threshold slope value. The second slope value is defined to be a second smallest slope value when being verified to be smaller than the second threshold slope value. For example, $m_5'$ listed in Table (4) is the said second smallest slope value. Consequently, the microprocessor 132 verifies that the sampling point F' is the (best) discharge starting point.

Second Embodiment

Figure 5:
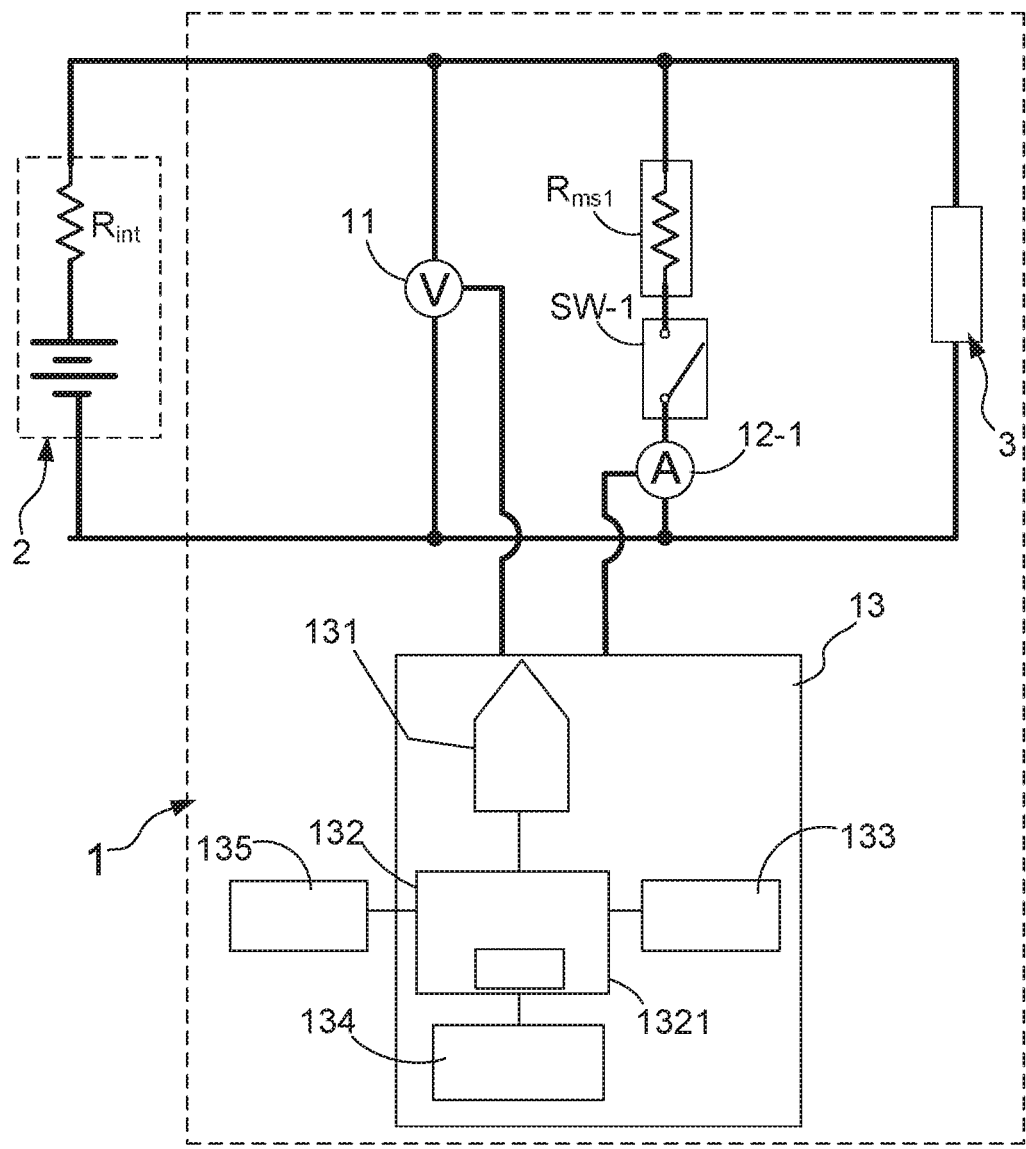
FIG. 5 shows a second circuit framework of the battery internal resistance measuring device according to the present invention.

With reference to FIG. 5, there is provided a second circuit framework of the battery internal resistance measuring device according to the present invention. After comparing FIG. 5 with FIG. 3, it is found that the second embodiment of the battery internal resistance measuring device 1 further comprises a time counting unit 135. By means of further explanation, it is difficult for the microprocessor 132 to find out the aforesaid differential values and/or slope values form the waveform of the discharge voltage signal in the case of the capacity of the battery 2 be almost exhausted. In the meantime, the time counting unit 135 is configured for counting a sampling time of the analog-to-digital converting unit 131, so as to inform the microprocessor 132 to stop the analog-to-digital converting unit 131 picking up the first voltage sampling values and the second voltage sampling values as the sampling time exceeding a threshold sampling time.

In addition, the present invention also provides a battery internal resistance measuring method capable of being implemented in an execution device such as the measurement controller 13. This battery internal resistance measuring method can also be established by using mathematical algorithms, so as to be embedded in the measurement controller 13 by a form of application program, library, variables, or operands.

Figure 6A:
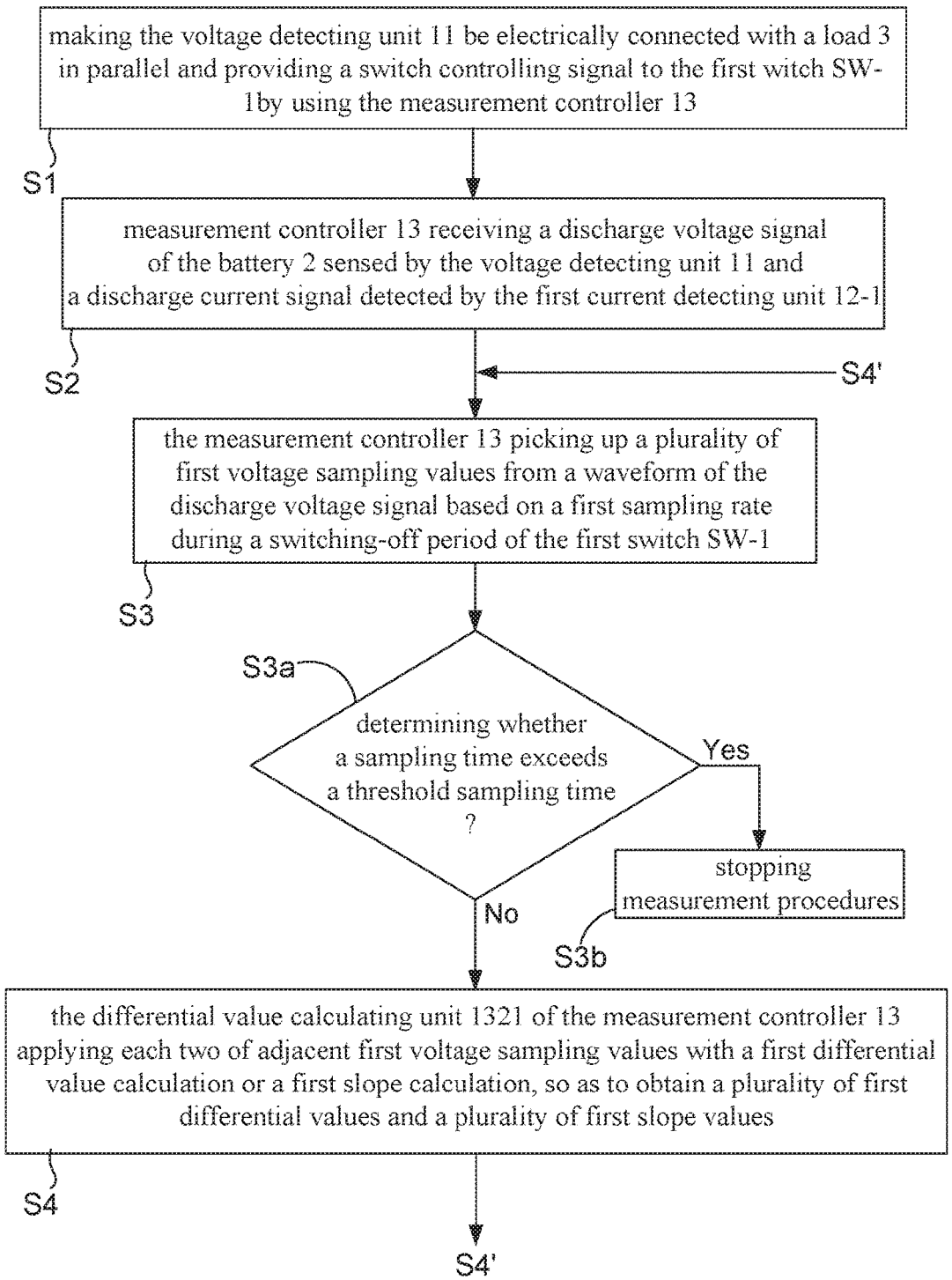
Figure 6B:
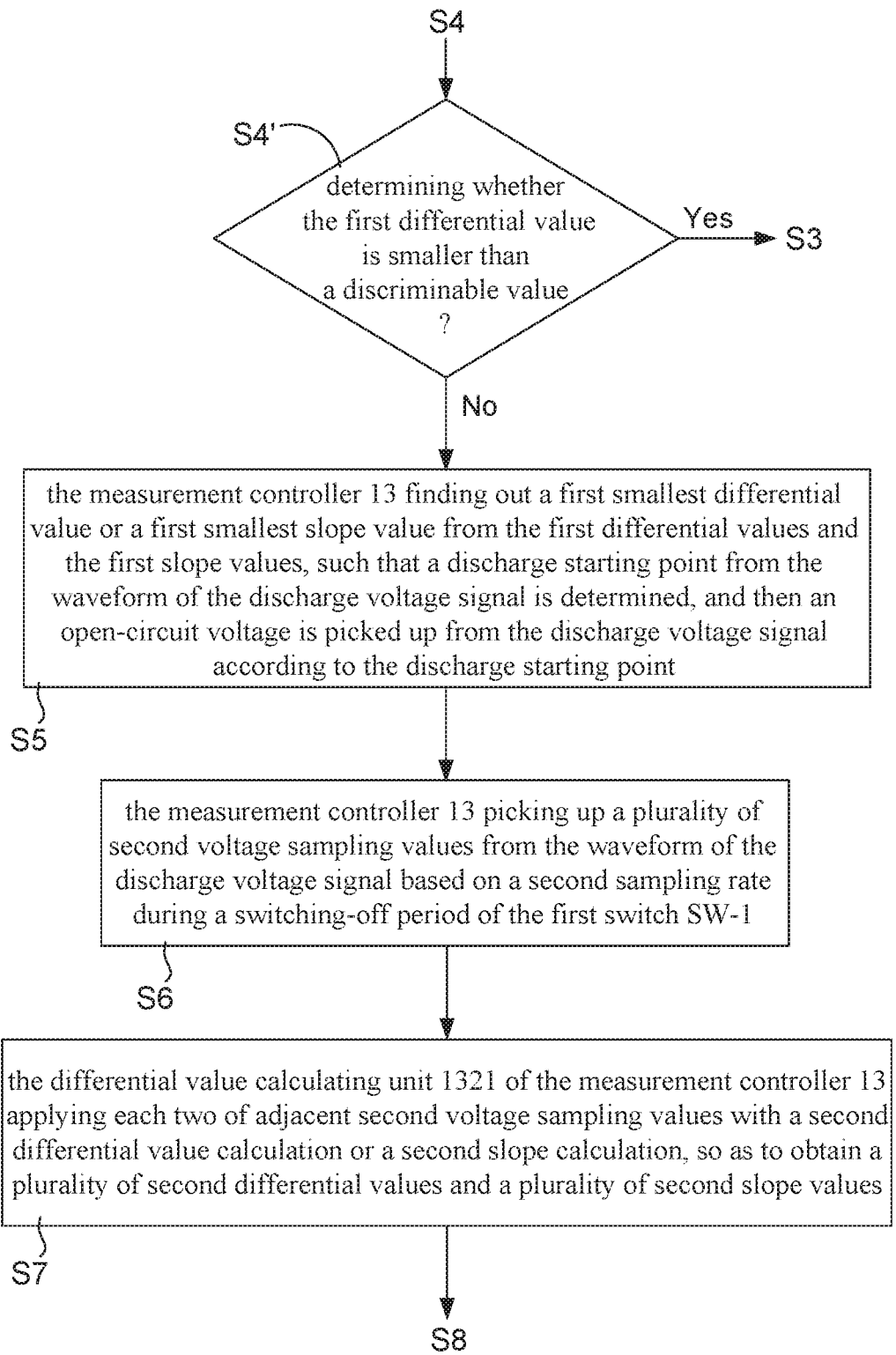

Referring to FIG. 4 and FIG. 5 again, and please simultaneously refer to FIG. 6A, FIG. 6B and FIG. 6C, which show flowchart diagrams of the battery internal resistance measuring method. The battery internal resistance measuring method mainly comprises 12 steps of:

step (S1): making the voltage detecting unit 11 be electrically connected with a load 3 in parallel and providing a switch controlling signal to the first witch SW-1 by using the measurement controller 13;

step (S2): measurement controller 13 receiving a discharge voltage signal of the battery 2 sensed by the voltage detecting unit 11 and a discharge current signal detected by the first current detecting unit 12-1;

step (S3): the measurement controller 13 picking up a plurality of first voltage sampling values from a waveform of the discharge voltage signal based on a first sampling rate during a switching-off period of the first switch SW-1;

step (S3a): determining whether a sampling time exceeds a threshold sampling time; if yes, proceeding to step (S3b); otherwise, proceeding to step (S4);

step (S3b): stopping measurement procedures;

step (S4): the differential value calculating unit 1321 of the measurement controller 13 applying each two of adjacent first voltage sampling values with a first differential value calculation or a first slope calculation, so as to obtain a plurality of first differential values and a plurality of first slope values;

step (S4'): determining whether the first differential value is smaller than a discriminable value;

step (S5): the measurement controller finding out a first smallest differential value or a first smallest slope value from the first differential values and the first slope values, such that a discharge starting point from the waveform of the discharge voltage signal is determined, and then an open-circuit voltage Vop is picked up from the discharge voltage signal according to the discharge starting point;

step (S6): the measurement controller 13 picking up a plurality of second voltage sampling values from the waveform of the discharge voltage signal based on a second sampling rate during a switching-on period of the first switch SW-1;

step (S7): the differential value calculating unit 1321 of the measurement controller 13 applying each two of adjacent second voltage sampling values with a second differential value calculation or a second slope calculation, so as to obtain a plurality of second differential values and a plurality of second slope values;

step (S8): the measurement controller 13 finding out a second smallest differential value or a second smallest slope value from the second differential values and the second slope values, such that a discharge ending point from the waveform of the discharge voltage signal is determined, and then a short-circuit voltage Vsh is picked up from the discharge voltage signal according to the discharge ending point; and step (S9): the measurement controller 13 calculating an internal resistance Rint of the battery 2 based on the open-circuit voltage, the short-circuit voltage and the resistance of the measurement resistor Rms1;

Third Embodiment

Figure 7:
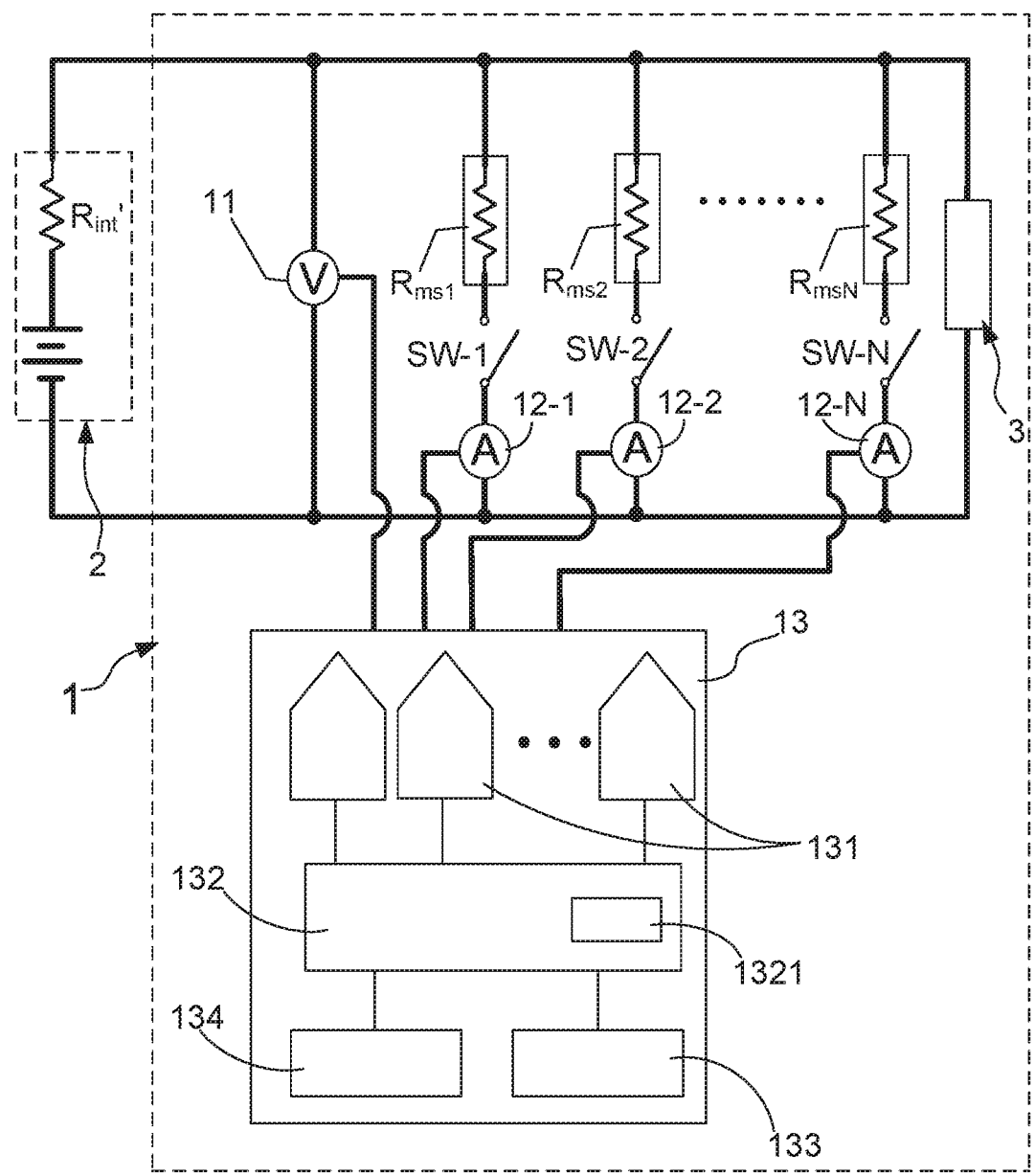
FIG. 7 shows a third circuit framework of the battery internal resistance measuring device.

Please continuously refer to FIG. 7, where a third circuit framework of the battery internal resistance measuring device is shown. From above descriptions, the fact understood that it is difficult for the microprocessor 132 to find out the aforesaid differential values and/or slope values form the waveform of the discharge voltage signal in the case of the capacity of the battery 2 be almost exhausted. The reason is that the battery internal resistance measuring device 1 shown as FIG. 5 just contain one measurement resistor Rms1 and one switch SW-1, such that the amplitude of the discharge current cannot be modulated by changing the resistance of the measurement resistor Rms1. In view of that, the present invention further provides a third embodiment of the battery internal resistance measuring device 1. After comparing FIG. 7 with FIG. 3, it is found that, in third circuit framework of the battery internal resistance measuring device 1, the numbers of the measurement resistor (Rms1, Rms2, RmsN), the switch (SW-1, SW-2, SW-N), and the current detecting unit (12-1, 12-2, 12-N) are further additionally expanded to N, and each of the additional measurement resistors (Rms2, RmsN), the additional switches (SW-2, SW-N), and the additional current detecting units (12-2, 12-N) are electrically connected to the voltage detecting unit 11 in parallel.

As FIG. 7 shows, the N number of measurement resistors comprises the aforesaid first measurement resistor Rms1, a second measurement resistor Rms2, . . . , and a N-th measurement resistor RmsN. Moreover, the N number of switches comprises the aforesaid first switch SW-1, a second switch SW-2, . . . , and a N-th switch SW-N. On the other hand, the N number of current detecting units comprises the aforesaid first current detecting unit 12-1, a second current detecting unit 12-2, . . . , and a N-th current detecting unit 12-N. It is worth noting that, the numbers of the analog-to-digital converting unit 131 is also expanded to N.

Fourth and Fifth Embodiments

Figure 8:
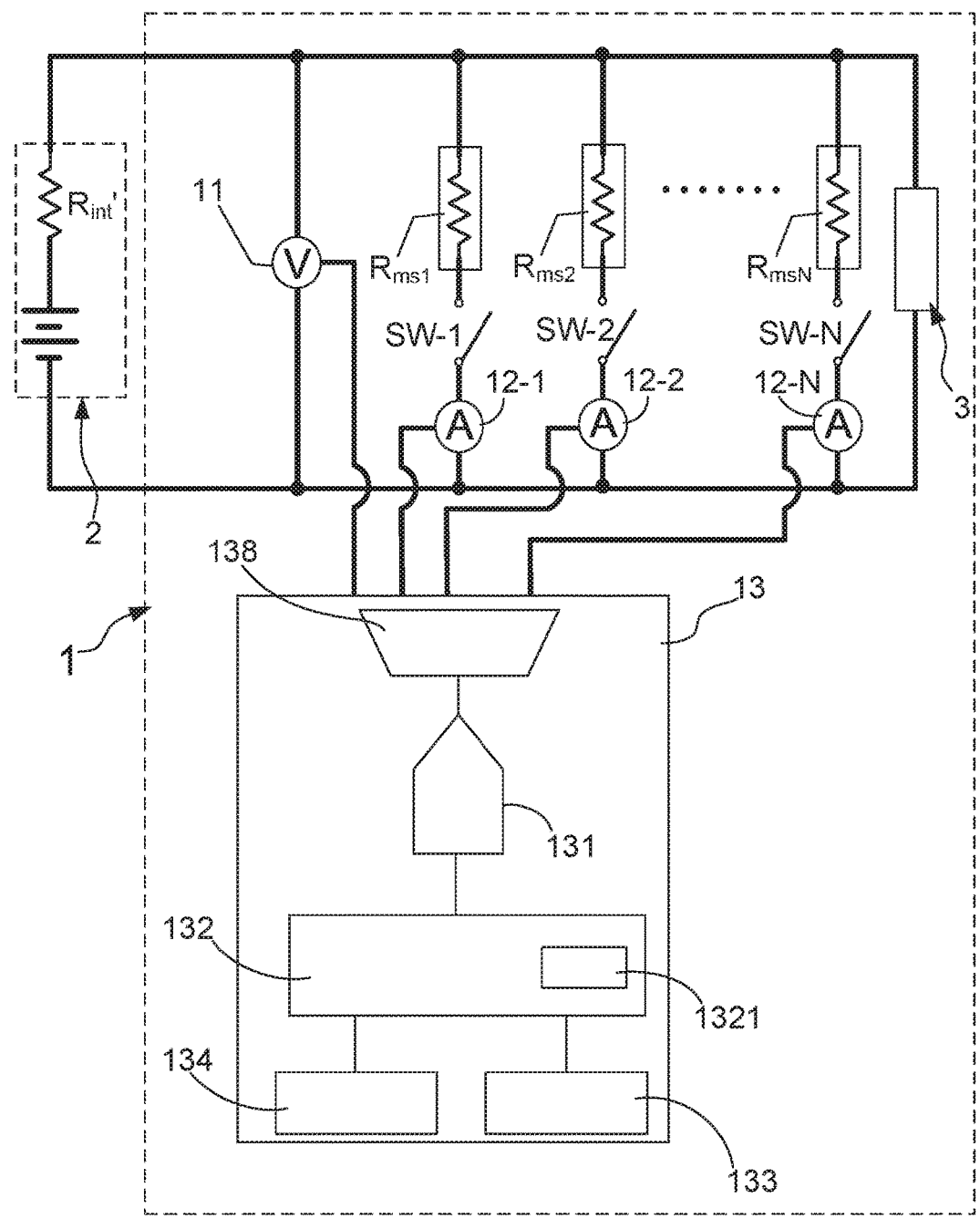
FIG. 8 shows a fourth circuit framework of the battery internal resistance measuring device.
Figure 9:
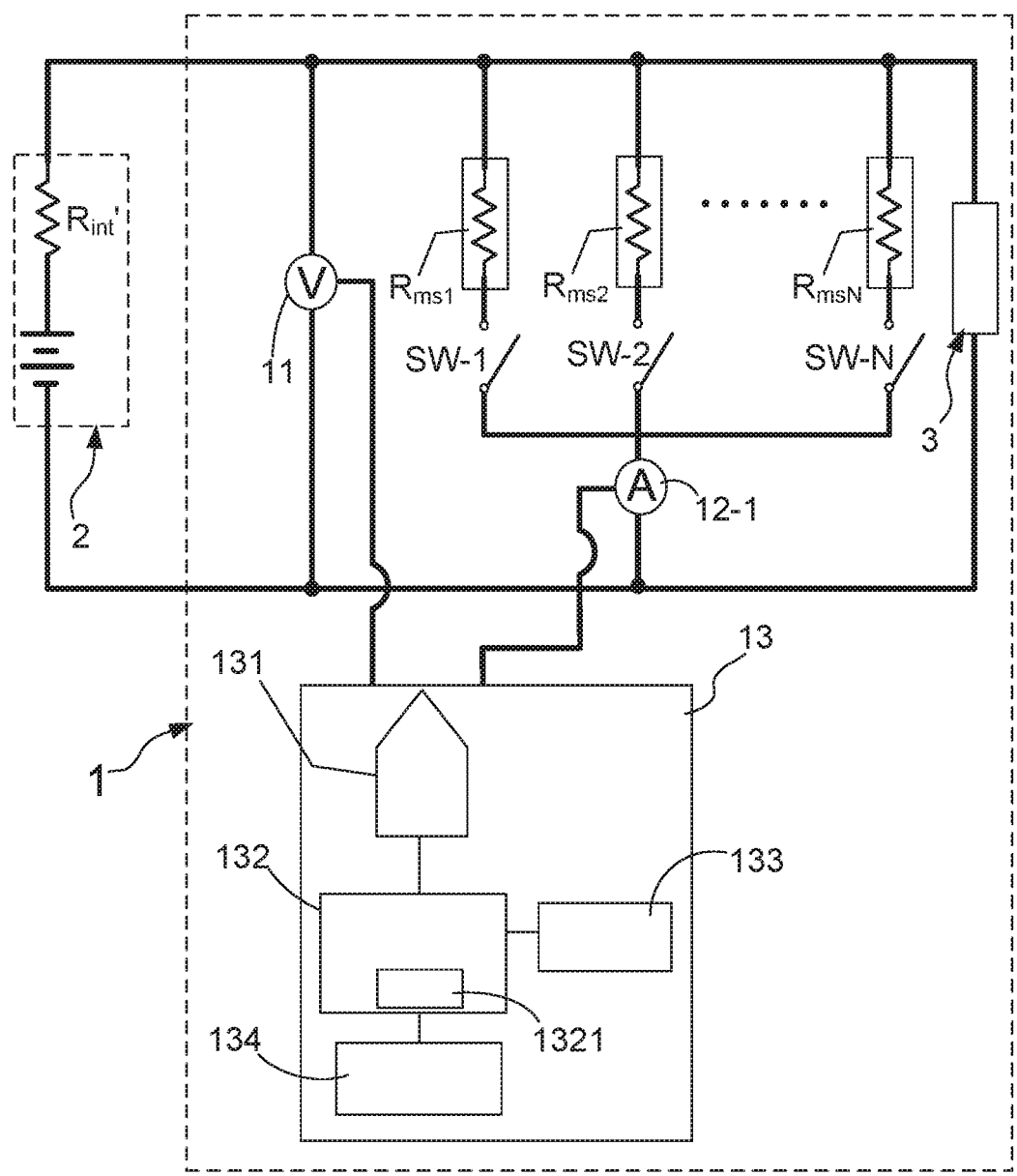
FIG. 9 shows a fifth circuit framework of the battery internal resistance measuring device.

FIG. 8 and FIG. 9 show a fourth circuit framework and a fifth circuit framework of the battery internal resistance measuring device, respectively. After comparing FIG. 8 with FIG. 7, engineers skilled in design and development of electronic circuits should know that, the fourth circuit framework of the battery internal resistance measuring device 1 further comprises a multiplexing unit 138, which is electrically connected between the N numbers of current detecting unit (12-1, 12-2, 12-N) and only one analog-to-digital converting unit 131, and used for making the only one analog-to-digital converting unit 131 able to process each of the discharge current signal. Moreover, after comparing FIG. 9 with FIG. 3, it is clear that the fifth circuit framework of FIG. 9 is obtained by adding N−1 number of measurement resistors (Rms2, RmsN) into the first circuit framework as shown in FIG. 3. Herein, it needs to further explain that there is just one current detecting unit (12-1) contained by the fifth circuit framework of the battery internal resistance measuring device 1.

Particularly, at an initial stage of the switching-off period, the measurement controller 13 (as FIG. 7 shows) would sequentially turn the N number of switches (SW-1, SW-2, SW-N) on when a differential value between any two of adjacent first voltage sampling values is over large or small, so as to make the differential value be greater than a discriminable value. Electronic engineers should know that, the part of discharge current would pass through the second measurement resistor Rms2 when the second switch SW-2 is switched on. Similarly, when the N-th switch SW-N is switched on, part of discharge current would pass through the N-th measurement resistor RmsN. By such way, the amplitude of the discharge current cannot be modulated by changing the resistance of the measurement resistors (Rms1, Rms2, RmsN). However, if the differential value is still smaller than a discriminable value in the case of all switched (SW-1, SW-2, SW-N) having been switched on, it is presumed that the battery cannot be used normally.

Briefly speaking, the third circuit framework (FIG. 7) of the battery internal resistance measuring device 1 has a function of changing resistance of measurement resistor, and this function facilitates the battery internal resistance measuring device 1 able to make a small capacity battery discharge by small current, and also capable of making a large capacity battery discharge by medium or larger current. Therefore, the battery internal resistance measuring device 1 is suitable for measuring difference internal resistances from various types of batteries.

Figure 1:
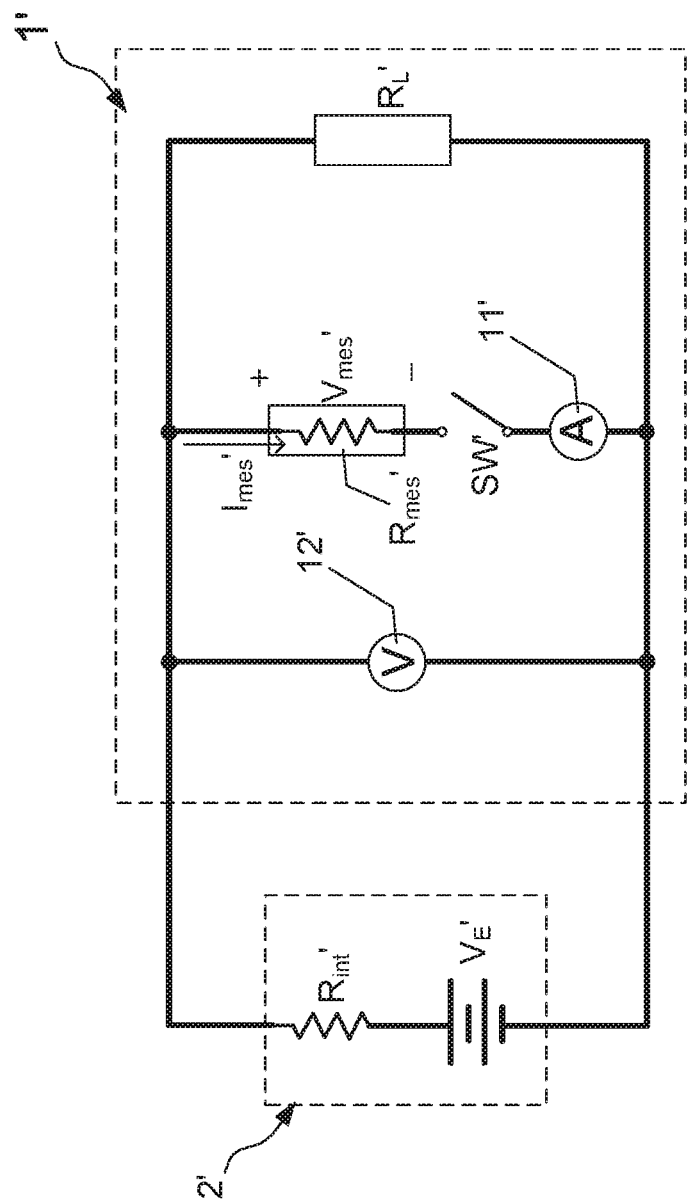
FIG. 1 shows a topology diagram of an internal resistance measuring circuit.

Therefore, through above descriptions, the battery internal resistance measuring device and the method thereof have been introduced completely and clearly; in summary, the present invention includes the advantages of:

(1) Owing to the fact that the conventional internal resistance measuring circuit (as shown in FIG. 1) fails to find out the best sampling time point from the waveform of a discharge voltage signal of a battery, the battery internal resistance measuring device 1 of the present invention is provided with the function to find a (best) discharge starting point and a (best) discharge ending point. The battery internal resistance measuring device 1 comprises a voltage detecting unit 11, at least one measurement resistor (Rms1), at least one switch (SW-1), at least one current detecting unit (12-1), and a measurement controller 13. By means of further explanation, the measurement controller 13 at least comprises a differential value calculating unit 1321 for treating a differential value calculation or a slope calculation to each two of adjacent voltage sampling values on the waveform of the discharge voltage signal of the battery, such that the measurement controller 13 can subsequently find out the (best) discharge starting point and the (best) discharge ending point according to data of the differential value calculations or the slope calculations. Eventually, the measurement controller 13 calculates an internal resistance of the battery after picking up an open-circuit voltage Vop and a short-circuit voltage Vsh from the discharge starting point and the discharge ending point.

The above description is made on embodiments of the present invention. However, the embodiments are not intended to limit scope of the present invention, and all equivalent implementations or alterations within the spirit of the present invention still fall within the scope of the present invention.

What is claimed is:

1. A battery internal resistance measuring device, comprising:
   a voltage detecting unit, being electrically connected to a battery;
   at least one measurement resistor, being electrically connected to the voltage detecting unit in parallel;
   at least one switch, being electrically connected to the measurement resistor in series; and
   a measurement controller, being electrically connected to the voltage detecting unit, and comprising a differential value calculating unit;
   wherein the voltage detecting unit is electrically connected with a load in parallel, such that the voltage detecting unit correspondingly provides a discharge voltage signal of the battery to the measurement controller as the measurement controller generates a switch controlling signal to the switch;
   wherein the measurement controller picks up a plurality of first voltage sampling values from a waveform of the discharge voltage signal based on a first sampling rate during a switching-off period of the switch, and the measurement controller picking up a plurality of second voltage sampling values from the waveform of the discharge voltage signal based on a second sampling rate during a switching-on period of the switch;
   wherein the differential value calculating unit is configured to apply a first differential value calculation or a first slope calculation to each two of adjacent first voltage sampling values, and also apply a second differential value calculation or a second slope calculation to each two of adjacent second voltage sampling values, such that the measurement controller find out a discharge starting point and a discharge ending point from the waveform of the discharge voltage signal.

2. The battery internal resistance measuring device of claim 1, further comprising:
   at least one current detecting unit, being electrically connected to the switch in series, and configured for correspondingly providing a discharge current signal to the measurement controller as the measurement controller generates the switch controlling signal to the switch.

3. The battery internal resistance measuring device of claim 2, wherein the measurement controller further comprises:
   an analog-to-digital converting unit, being used for picking up the first voltage sampling values and the second voltage sampling values based on the first sampling rate and the second sampling rate, respectively;
   a microprocessor, being electrically connected to the analog-to-digital converting unit and comprising the differential value calculating unit, and used for finding out the discharge starting point and the discharge ending point from the waveform of the discharge voltage signal according to data provided by the differential value calculating unit;
   a storage unit, being electrically connected to the microprocessor; and
   an output unit, being electrically connected to the microprocessor.

4. The battery internal resistance measuring device of claim 3, wherein the measurement controller further comprises:
   a time counting unit, being used for counting a sampling time of the analog-to-digital converting unit, so as to inform the microprocessor to stop the analog-to-digital converting unit picking up the first voltage sampling values and the second voltage sampling values in the case of the sampling time exceeding a threshold sampling time.

5. The battery internal resistance measuring device of claim 4, wherein a number of each of the measurement resistor, the switch, and the current detecting unit is further additionally expanded to be greater than two, and each of the additional measurement resistors, the additional switches, and the additional current detecting units are electrically connected to the voltage detecting unit in parallel.

6. The battery internal resistance measuring device of claim 5, wherein at an initial stage of the switching-off period, the measurement controller sequentially turns all of the switches on as a differential value between any two of adjacent first voltage sampling values is excessive large or small, so as to make the differential value be greater than a verifiable value.

7. The battery internal resistance measuring device of claim 5, wherein a number of the analog-to-digital converting unit is also expanded to be greater than two.

8. The battery internal resistance measuring device of claim 5, wherein the measurement controller further comprises:
   a multiplexing unit, being electrically connected between the current detecting units and the analog-to-digital converting unit, for making the analog-to-digital converting unit process each of the discharge current signal.

9. The battery internal resistance measuring device of claim 1, wherein the first sampling rate is equal to the second sampling rate.

10. The battery internal resistance measuring device of claim 1, wherein the first sampling rate is different from the second sampling rate.

11. A battery internal resistance measuring method, comprising following steps:
    (1) providing a battery internal resistance measuring device comprising a voltage detecting unit electrically connected to a battery, at least one measurement resistor electrically connected to the voltage detecting unit in parallel, at least one switch electrically connected to the measurement resistor in series, and a measurement controller electrically connected to the voltage detecting unit; and then, making the voltage detecting unit be electrically connected with a load in parallel and providing a switch controlling signal to the switch by using the measurement controller;

(2) receiving a discharge voltage signal of the battery sensed by the voltage detecting unit by the measurement controller;

(3) the measurement controller picking up a plurality of first voltage sampling values from a waveform of the discharge voltage signal based on a first sampling rate during a switching-off period of the switch;

(4) a differential value calculating unit of the measurement controller applying each two of adjacent first voltage sampling values with a first differential value calculation or a first slope calculation, so as to obtain a plurality of first differential values and a plurality of first slope values;

(5) the measurement controller finding out a first smallest differential value or a first smallest slope value from the first differential values and the first slope values, such that a discharge starting point from the waveform of the discharge voltage signal is determined, and then an open-circuit voltage is picked up from the discharge voltage signal according to the discharge starting point;

(6) the measurement controller picking up a plurality of second voltage sampling values from the waveform of the discharge voltage signal based on a second sampling rate during a switching-on period of the switch;

(7) the differential value calculating unit of the measurement controller applying each two of adjacent second voltage sampling values with a second differential value calculation or a second slope calculation, so as to obtain a plurality of second differential values and a plurality of second slope values;

(8) the measurement controller finding out a second smallest differential value or a second smallest slope value from the second differential values and the second slope values, such that a discharge ending point from the waveform of the discharge voltage signal is determined, and then a short-circuit voltage is picked up from the discharge voltage signal according to the discharge ending point; and (9) the measurement controller calculating an internal resistance of the battery based on the open-circuit voltage, the short-circuit voltage and the resistance of the measurement resistor.

12. The battery internal resistance measuring method of claim 11, wherein the first differential value is verified to be the first smallest differential value when being smaller than a first threshold differential value, and the second differential value being verified to be the second smallest differential value when being smaller than a second threshold differential value.

13. The battery internal resistance measuring method of claim 11, wherein the first slope value is verified to be the first smallest slope value when being smaller than a first threshold slope value, and the second slope value being verified to be the second smallest slope value when being smaller than a second threshold slope value.

14. The battery internal resistance measuring method of claim 11, further comprising following step connected between the step (4) and the step (5):

(4') determining whether the first differential value is smaller than a verifiable value; if yes, proceeding back to the step (3); otherwise, proceeding to the step (5).

15. The battery internal resistance measuring method of claim 11, further comprising following step connected between the step (4) and the step (5):

a time counting unit, being used for counting a sampling time of the analog-to-digital converting unit during execution of the step (3) and the step (4), so as to inform the microprocessor to stop the analog-to-digital converting unit picking up the first voltage sampling values and the second voltage sampling values in the case of the sampling time exceeding a threshold sampling time.

16. The battery internal resistance measuring method of claim 11, wherein a number of each of the measurement resistor, and the switch is further additionally expanded to be greater than two, and each of the additional measurement resistors and the additional switches are electrically connected to the voltage detecting unit in parallel; wherein the battery internal resistance measuring method further comprises following step connected between the step (4) and the step (5):

(4a) determining whether the first differential value is smaller than a discriminable value; if yes, proceeding back to the step (4b); otherwise, proceeding to the step (5); and (4b) the measurement controller sequentially turning next switch on, and then proceeding back to the step (3).

17. The battery internal resistance measuring method of claim 16, wherein the battery internal resistance measuring device further comprises:

a time counting unit, being used for counting a sampling time of the analog-to-digital converting unit during execution of the step (3) and the step (4), so as to inform the microprocessor to stop the analog-to-digital converting unit picking up the first voltage sampling values and the second voltage sampling values in the case of the sampling time exceeding a threshold sampling time.

* * * * *